(12) United States Patent
Hojat (10) Patent No.: US 6,944,811 B2
(45) Date of Patent: Sep. 13, 2005

(54) BLOCKAGE AWARE ZERO SKEW CLOCK ROUTING METHOD

(75) Inventor: Shervin Hojat, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 517 days.

(21) Appl. No.: 10/215,133

(22) Filed: Aug. 7, 2002

(65) Prior Publication Data

US 2004/0059969 A1 Mar. 25, 2004

(51) Int. Cl.$^7$ ................................................. G06F 11/00
(52) U.S. Cl. ........................................... 714/744; 716/6
(58) Field of Search ........................ 327/141; 375/356; 716/12, 18, 6; 714/744

(56) References Cited

U.S. PATENT DOCUMENTS

| | | | | |
|---|---|---|---|---|
| 5,272,390 A | * | 12/1993 | Watson et al. | 327/141 |
| 5,550,875 A | * | 8/1996 | Bennett | 375/356 |
| 5,889,682 A | * | 3/1999 | Omura et al. | 716/12 |
| 6,327,696 B1 | * | 12/2001 | Mahajan | 716/12 |
| 6,701,507 B1 | * | 3/2004 | Srinivasan | 716/10 |
| 6,751,786 B2 | * | 6/2004 | Teng et al. | 716/18 |

OTHER PUBLICATIONS

IBM, "Zero Skew Techniques for VLSI Systems", IBM Technical Disclosure Bulletin, Jan. 1992, vol. 34, pp. 233–240.*

IBM, "Process–Variation–Tolerant Zero Skew Clock Routing", IBM Technical Disclosure Bulletin, Feb. 1994, vol. 37, pp. 189–198.*

Boese, K. and Kahng, K., "Zero–Skew Clock Routing Trees With Minimum Wirelength", IEEE, 0–7803–0768–2, 1992, pp. 17–21.

M. Edahiro, "A Clustering–Based Optimization Algorithm in Zero–Skew Routings", ACM/IEEE Design Automation Conf., Jun. 1993, pp. 612–616.

R.S. Tsay, "Exact Zero Skew", Proc. IEEE Int'l Conference on Computer Aided Design, 1991, pp. 336–339.

* cited by examiner

Primary Examiner—David Ton
(74) Attorney, Agent, or Firm—Gunnison, McKay & Hodgson, L.L.P.; Philip J. McKay (57) ABSTRACT

A blockage aware zero skew clock routing method for calculating the distance, and therefore the delay, between two points takes into account any blockages along the path between the two points and therefore creates a more usable and realistic measure of delay and allows for minimization, or elimination, of clock skew in the system being designed using the method of the invention.

18 Claims, 7 Drawing Sheets

BLOCKAGE AWARE ZERO SKEW CLOCK ROUTING METHOD

FIELD OF THE INVENTION

The present invention is directed to the field of electronic component design and, more particularly, to methods for minimizing, or eliminating, clock skew in microprocessor design.

BACKGROUND OF THE INVENTION

For the present, virtually all mainstream electronic components and systems, such as microprocessors, are synchronous systems employing one or more system clocks that act as the driving force or "heart" of the electronic system. As a result, more often than not, it is critical that a given system clock signal arrive at various points in the system at virtually the same time. As discussed below, this situation can create a significant complication.

Figure 1:
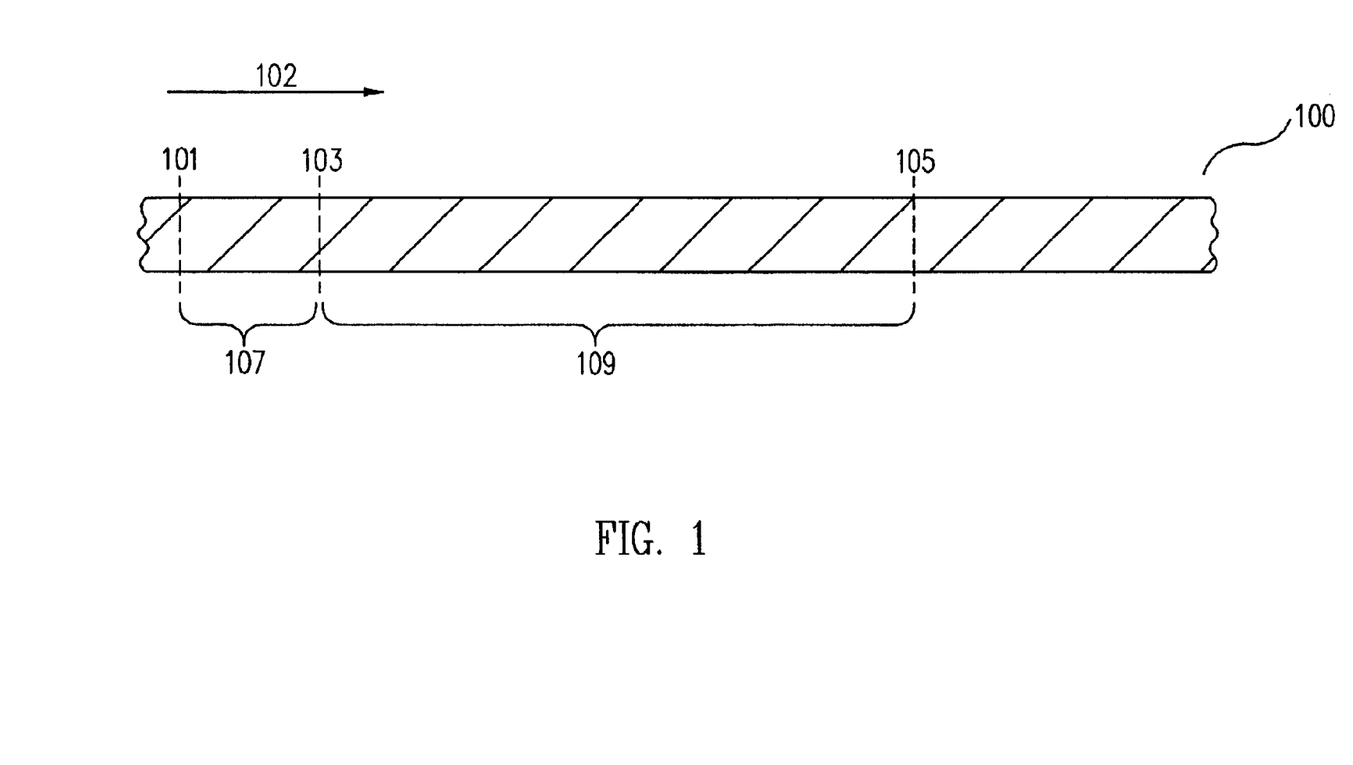
FIG. 1 shows a typical length of wire 100.

FIG. 1 shows a typical length of wire 100 including, from left to right, in the direction shown by arrow 102, points 101, 103 and 105.

As is well known, the physics of conductors and wave propagation dictate two important facts: first, the absolute speed limit for any signal moving from point 101 to points 103 or 105 is the speed of light; second, since wire 100 is typically a metallic conductor, with an inherent resistance, a signal propagating in wire 100 will actually travel at a speed significantly less than the speed of light.

As a result of these physical limitations on the speed at which a signal can propagate through wire 100, it follows that the greater the distance between two points on/in wire 100, the longer it takes the signal to reach the point. Consequently, a signal traveling from point 101, in the direction shown by arrow 102, will take less time to reach point 103, i.e., travel distance 107, than it will take to reach point 105, i.e., travel distance 107 and distance 109, and there is a time delay between when the signal reaches point 103 and when it reaches point 105. In addition, as can be seen from the discussion above, as long as wire 100 has a reasonably consistent composition and the wire lies on the same metal layer, the time delay is typically proportional to the distance traveled, i.e., twice the distance results in approximately twice the delay.

As mentioned above, in a typical microprocessor, a given system clock signal arrives at one or more pins located around the periphery of the microprocessor chip. In addition, there are typically numerous points, located at different distances from the periphery of the chip and the clock pins, which must receive the clock signal at the same time. Given the discussion above with respect to FIG. 1, it can be understood that the problem of ensuring a given clock signal received at a first point arrives, virtually simultaneously, at various other points, at various distances from the first point, and connected to the first point by differing length wires, such as wire 100, is significant.

The introduction of a time delay, also called simply a "delay", between when one point receives a clock signal and when a second point, that should receive the clock signal at the same time, actually receives the clock signal is known as clock skew. Consequently, the ideal system has a zero clock skew, or at least a minimal clock skew. If clock skew becomes too large, the system, at a minimum, will operate inefficiently, typically slower with more errors. In addition, if the clock skew is more extreme, the system architecture will simply break down and the microprocessor will introduce so many errors that the system will fail.

As clock speeds become faster and faster, and more operations are required per clock, the problem of clock skew becomes even more pronounced and the margin for error is further reduced. However, this problem is not new and several mechanisms are in wide use in the art to reduce the clock skew problem including using multiple clock inputs, using multiple clock signals, and introducing delays between points to slow down the signal between close points so the more distant points receive the signal at the same time as the close points.

Virtually every mechanism in use today to minimize or eliminate clock skew requires that the time delay, between the arrival of a signal at two points, typically the clock input pin and another point within the chip, be known. In the prior art the method of calculating this time delay was to simply calculate the distance between the two points and then use this "raw" distance to estimate delay. One problem with these prior art methods was that they failed to take into account blockages between two points.

Blockages between two points in a microprocessor are typically created by the placement of circuit blocks, reserved channels and routing, pre-existing power and ground terminals, or one of several other microprocessor components, along the path between the two points. As noted above, in the prior art, the existence of these blockages was simply ignored and it was assumed there were no blockages.

In the prior art, the "raw" distance, i.e., the distance not taking into account blockages, between points was then used to determine delay. In the prior art, when a blockage did exist, it was simply routed around. However, in the prior art, the additional reroute distance was never used to re-calculate delay and therefore a certain amount of clock skew was almost guaranteed to be introduced using prior art methods. As noted above, as microprocessor speeds continue to increase to the 3 and 4 gigahertz level, it is becoming imperative that clock skew be absolutely minimized or eliminated, to ensure proper microprocessor function.

What is needed is a more accurate and realistic method for calculating delay between two points in microprocessors.

SUMMARY OF THE INVENTION

According to the invention, a blockage aware zero skew clock routing method for calculating the distance, and therefore the delay, between two points takes into account any blockages along the path between the two points and therefore creates a more usable and realistic measure of delay and allows for minimization, or elimination, of clock skew in the system being designed using the method of the invention.

In one embodiment of the invention, the blockage aware zero skew clock routing method begins and a first point and second point are designated. A path between the first and second points is then checked for blockages. If no blockages are present then the "raw" distance between the first and second points is also the effective distance and the "raw" distance is used to estimate the delay between the first and second points. If a blockage is present, then according to the invention, the path with the blockage is treated as an exception and is either further processed or simply taken out of consideration.

In another embodiment of the invention, the blockage aware zero skew clock routing method begins and a first point and second point are designated. A path between the first and second points is then chosen. According to this embodiment of the invention, the "raw" distance between the first and second points is then calculated. Once the "raw" distance is calculated, the chosen path between the first and second points is then checked for blockages. If no blockages are present then the "raw" distance between the first and second points is also the effective distance and the "raw" distance is used to estimate the delay between the first and second points. If a blockage is present, then according to the invention, the path with the blockage is treated as an exception and a by-pass path is chosen to channel the signal around the blockage. The length of the by-pass path is then calculated and added to the "raw" distance calculated above. The delay is then estimated using the effective distance consisting of the combined "raw" distance and by-pass path distance.

Unlike prior art methods, using the blockage aware zero skew clock routing method of the invention, the inevitable path blockages, such as those created by the placement of circuit blocks, reserved channels and routing, pre-existing power and ground terminals, or one of several other microprocessor components, along the path between two points is not ignored and the blockages are considered in making delay determinations. In addition, in one embodiment of the invention, the delay associated with a by-pass path is accurately calculated and added to the analysis to provide even greater flexibility and accuracy. Consequently, electronic systems designed according to the method of the invention will have less clock skew problems and will therefore show improved performance at today's higher clock speeds.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

According to the invention, a blockage aware zero skew clock routing method (400 in FIG. 4 and 500 in FIG. 5) for calculating the distance, and therefore the delay on the same metal layer, between two points takes into account any blockages (220, 221, and 222 in FIGS. 2A and 3A) along the path between the two points and therefore creates a more usable and realistic measure of delay and allows for minimization, or elimination, of clock skew in the system being designed using the method of the invention.

Figure 4:
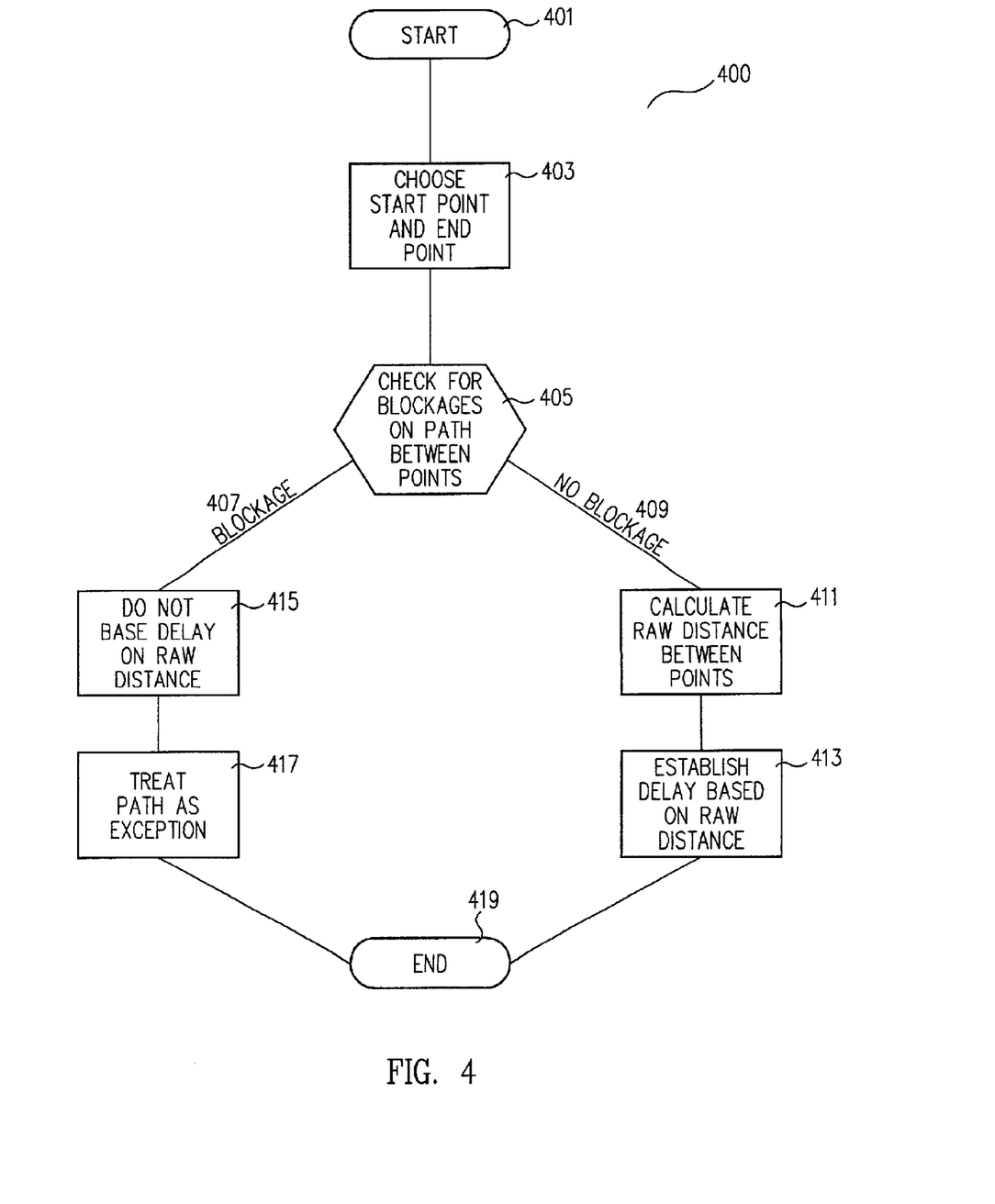
FIG. 4 shows one embodiment of a blockage aware zero skew clock routing method according to the principles of the present invention.

In one embodiment of the invention, the blockage aware zero skew clock routing method (400 in FIG. 4) begins (401 in FIG. 4) and a first point and second point are designated (403 in FIG. 4). A path between the first and second points is then checked for blockages (405 in FIG. 4). If no blockages are present (409 in FIG. 4) then the "raw" distance is calculated between the first and second points (411 in FIG. 4) and this "raw" distance is also the effective distance. The "raw" distance is then used to estimate the delay between the first and second points (413 in FIG. 4) and the method ends (419 in FIG. 4). If a blockage is present (407 in FIG. 4), then according to the invention, the "raw" distance is not calculated (415 in FIG. 4) and the path with the blockage is treated as an exception (417 in FIG. 4) and is either further processed or simply taken out of consideration.

Figure 5:
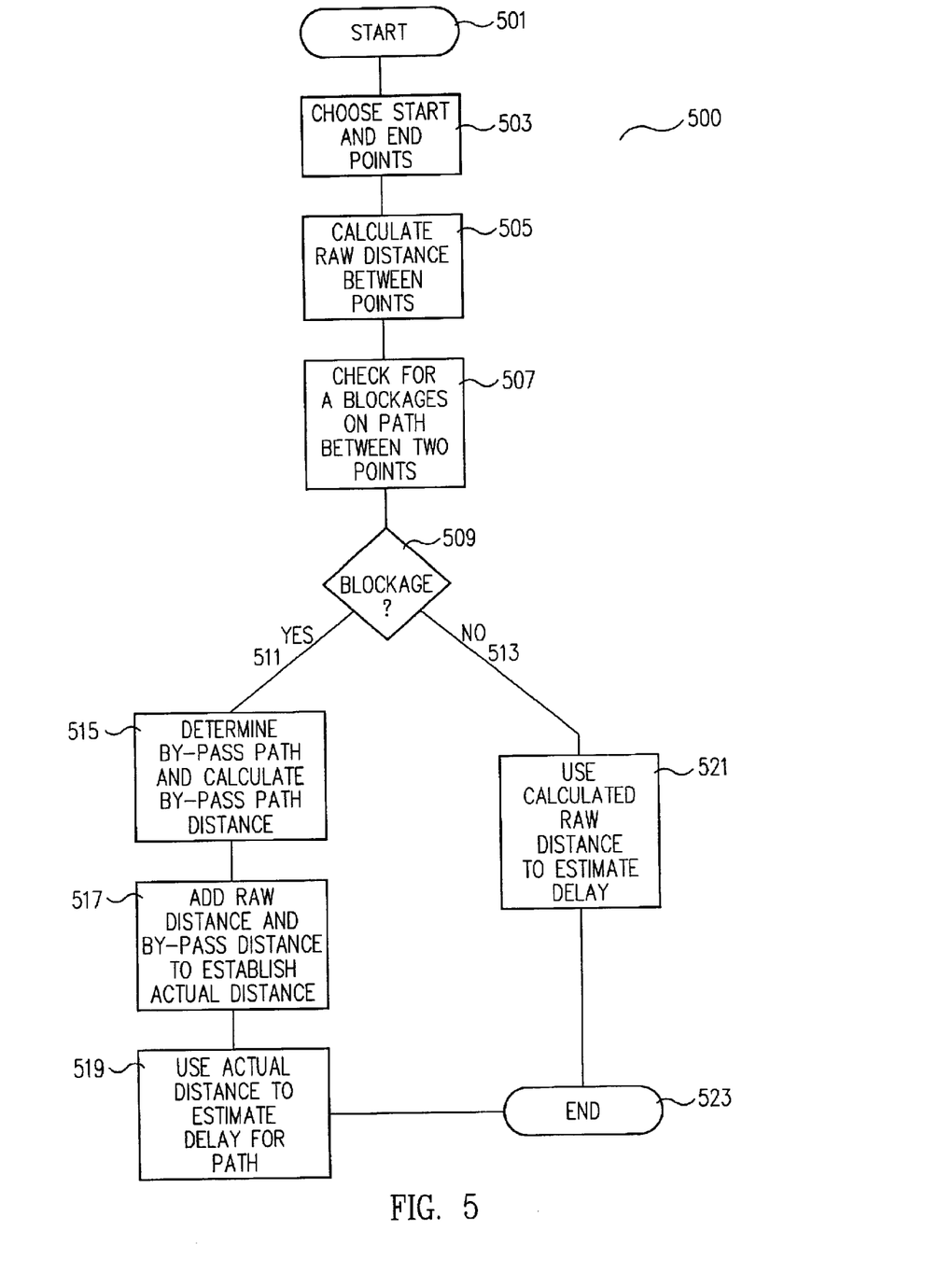
FIG. 5 shows one embodiment of a blockage aware zero skew clock routing method according to the principles of the present invention.

In another embodiment of the invention, the blockage aware zero skew clock routing method (500 in FIG. 5) begins (501 in FIG. 5) and a first point and second point are designated (503 in FIG. 5). A path between the first and second points is then chosen and, according to this embodiment of the invention, the "raw" distance between the first and second points is then calculated (505 in FIG. 5). Once the "raw" distance is calculated, the chosen path between the first and second points is then checked for blockages (507 in FIG. 5). If no blockages are present (509 and 513 in FIG. 5), then the "raw" distance between the first and second points is also the effective distance and the "raw" distance is used to estimate the delay between the first and second points (521 in FIG. 5) and the method ends (523 in FIG. 5). If a blockage is present (509 and 511 in FIG. 5), then according to the invention, the path with the blockage is treated as an exception and a by-pass path to channel the signal around the blockage is determined (515 in FIG. 5). The length of the by-pass path is then calculated and added to the "raw" distance calculated above (517 in FIG. 5). The delay is then estimated using the effective distance consisting of the combined "raw" distance and by-pass path distance (519 in FIG. 5).

As discussed above, unlike prior art methods, using the blockage aware zero skew clock routing method of the invention, the inevitable path blockages such as those created by the placement of circuit blocks, reserved channels and routing, pre-existing power and ground terminals, or one of several other microprocessor components, along the path between two points is not ignored, as it was in the prior art, and the blockages are considered in making delay determinations. In addition, in one embodiment of the invention, the delay associated with a by-pass path is accurately calculated and added to the analysis to provide even greater flexibility and accuracy. Consequently, electronic systems designed according to the method of the invention will have less clock skew problems and will therefore show improved performance at today's higher clock speeds.

Figure 2A:
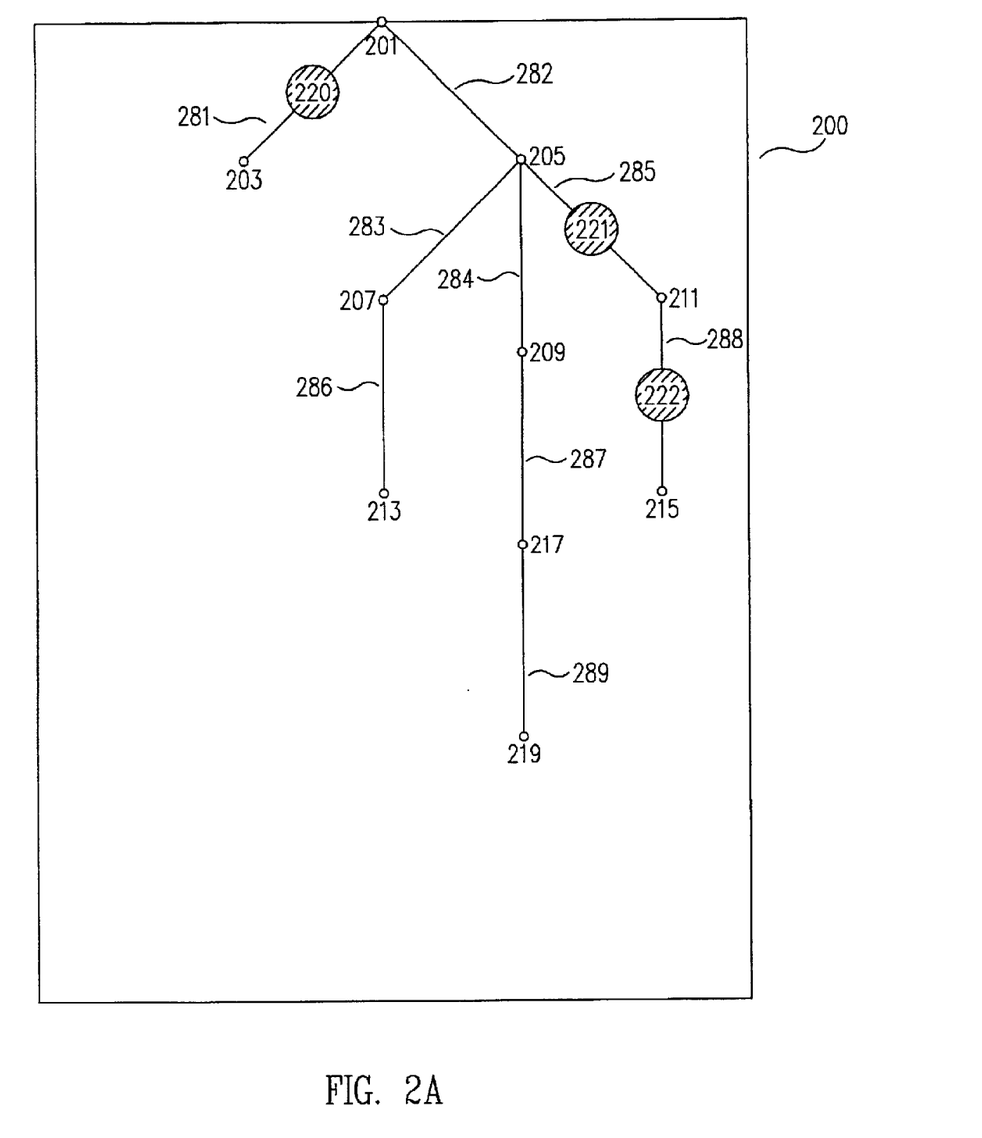
FIG. 2A shows a simplified representation of a microprocessor chip including a clock input pin and various points and blockages on the chip.

FIG. 2A shows a simplified representation of a microprocessor chip 200 including a clock input pin 201, or point 201, and various points (203, 205, 207, 209, 211, 213, 215, 217, and 219). For illustrative purposes, and simplicity: path segment 281, between points 201 and 203; path segment 282, between points 201 and 205; path segment 283, between points 205 and 207; path segment 284, between points 205 and 209; path segment 285, between points 205 and 211; path segment 286, between points 207 and 213; path segment 287, between points 209 and 217; path segment 288, between points 211 and 215; and path segment 289, between points 217 and 219 are all of equal "raw" length, or distance between points. Those of skill in the art will recognize that this is, of course, an idealized case, used to simplify the following discussion, and that the length of the path segments could all be different.

Also shown in FIG. 2A are: blockage 220, on path segment 281, between points 201 and 203; blockage 221, on path segment 285, between points 205 and 211; and blockage 222, on path segment 288, between points 211 and 215. As discussed above, blockages 220, 221 and 222 are typically created by the placement of circuit blocks, reserved channels and routing, pre-existing power and ground terminals, or one of several other microprocessor components, along the path between two points.

Figure 2B:
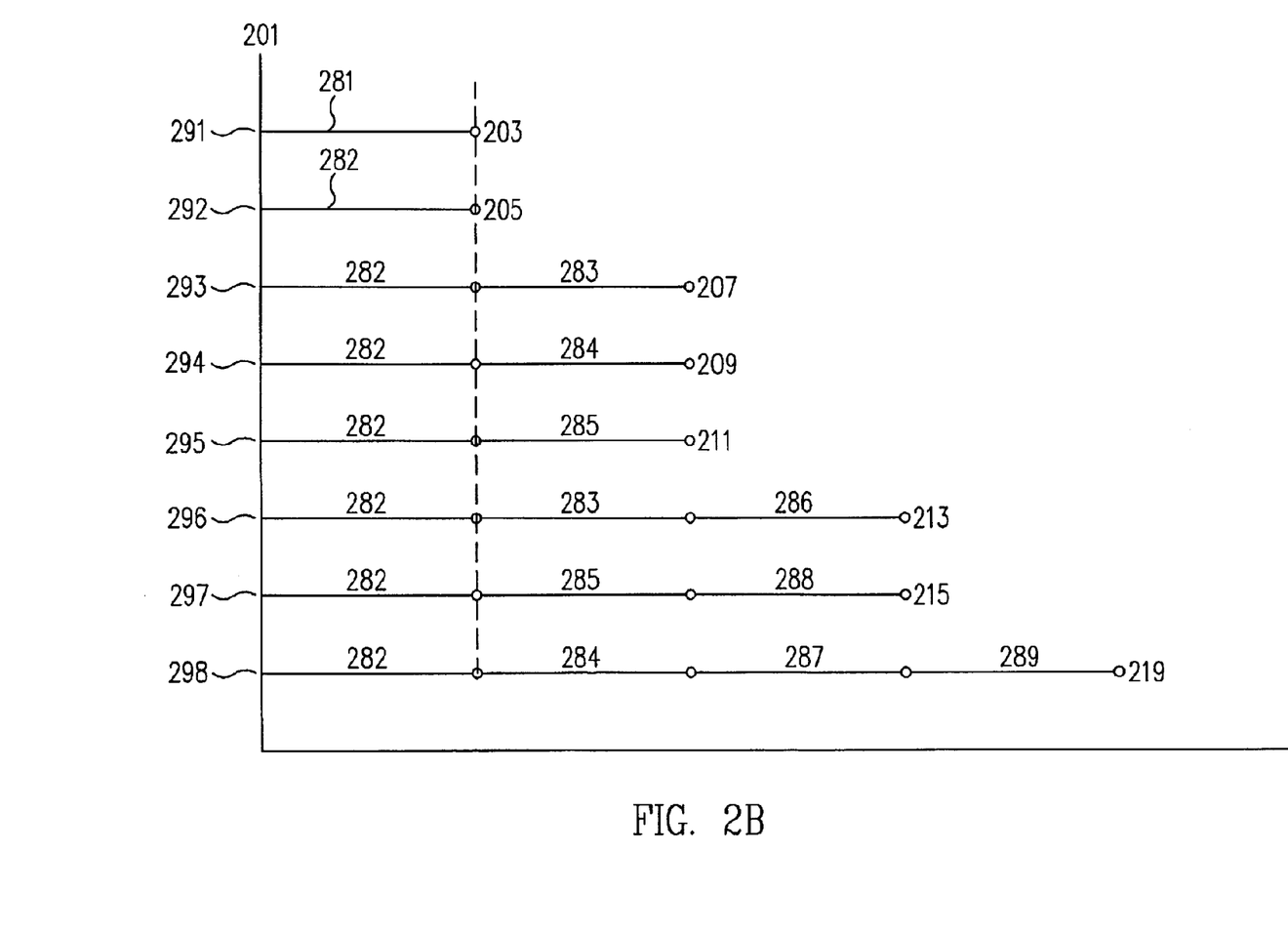
FIG. 2B shows the result of a distance/delay analysis as would be calculated using prior art methods alone.

FIG. 2B shows the result of a distance/delay analysis as would be calculated simply using the raw distances between points. As seen in FIG. 2B, viewed in combination with FIG. 2A, calculating only "raw" distances, path 291, connecting points 201 and 203, is simply the length of path segment 281, or one "unit". Likewise, calculating only "raw" distances, path 292 connecting points 201 and 205 is simply the length of path segment 282, or one "unit". Calculating only "raw" distances, path 293, connecting points 201 and 207, is the combined length of path segment 282 and path segment 283, or two "units" and path 294, connecting points 201 and 209, is the combined length of path segment 282 and path segment 284, or two "units". Likewise, calculating only "raw" distances, path 295, connecting points 201 and 211, is the combined length of path segment 282 and path segment 285, or two "units". Calculating only "raw" distances, path 296, connecting points 201 and 213, is the combined length of path segments 282, 283 and 286, or three "units" and path 297, connecting points 201 and 215, is the combined length of path segments 282, 285 and 288, or three "units". Finally, calculating only "raw" distances, path 298, connecting points 201 and 219, is the combined length of path segments 282, 284 287 and 289, or four "units".

As discussed above, using only the "raw" distances, as was done in the prior art, paths 291 and 292 would be treated as equal length and, therefore, it would be assumed that a clock signal traveling from point 201 to points 203 and 205 would arrive at the same time. Likewise, paths 293, 294 and 295 would be treated as equal length and it would be assumed that a clock signal traveling from point 201 to points 207, 209 and 211 would arrive at the same time. In addition, using only the "raw" distances, as was done in the prior art, paths 296 and 297 would be treated as equal length and, therefore, it would be assumed that a clock signal traveling from point 201 to points 213 and 215 would arrive at the same time.

Figure 3A:
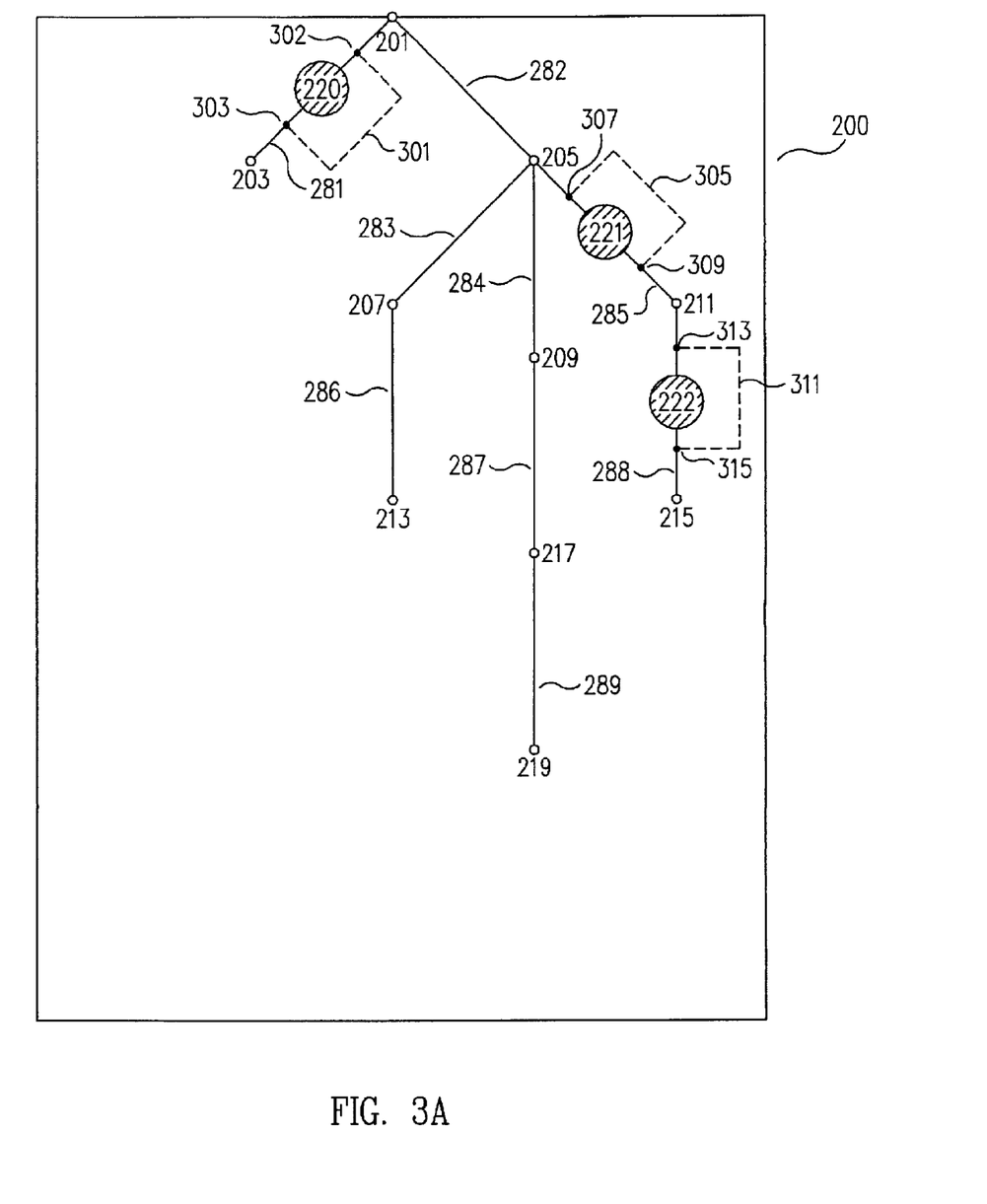
FIG. 3A shows the simplified representation of a microprocessor chip of FIG. 2A including a clock input pin and various points, blockages and by-pass paths on the chip.

As also discussed above, using only the "raw" distances, as was done in the prior art, completely ignores blockages 220, 221 and 222. However, on a real microprocessor chip 200, blockages 220, 221 and 222 do exist and must be dealt with to avoid signal blockage. FIG. 3A shows the simplified representation of microprocessor chip 200 including by-pass paths 301, 305 and 311 around blockages 220, 221 and 222, respectively. As shown in FIG. 3A, by-pass path 301 connects points 302 and 303 to by-pass blockage 220 on path segment 281 and by-pass path 305 connects points 307 and 309 to by-pass blockage 221 on path segment 285. Likewise, by-pass path 311 connects points 313 and 315 to by-pass blockage 222 on path segment 288. For simplicity of illustration, it is assumed in the following discussion that the length of by-pass paths 301, 305 and 311 are equal to one "unit" as defined above. Those of skill in the art will recognize that this is, of course, an idealized case, used to simplify the following discussion, and that the length of paths 301, 305 and 311 could all be different.

Figure 3B:
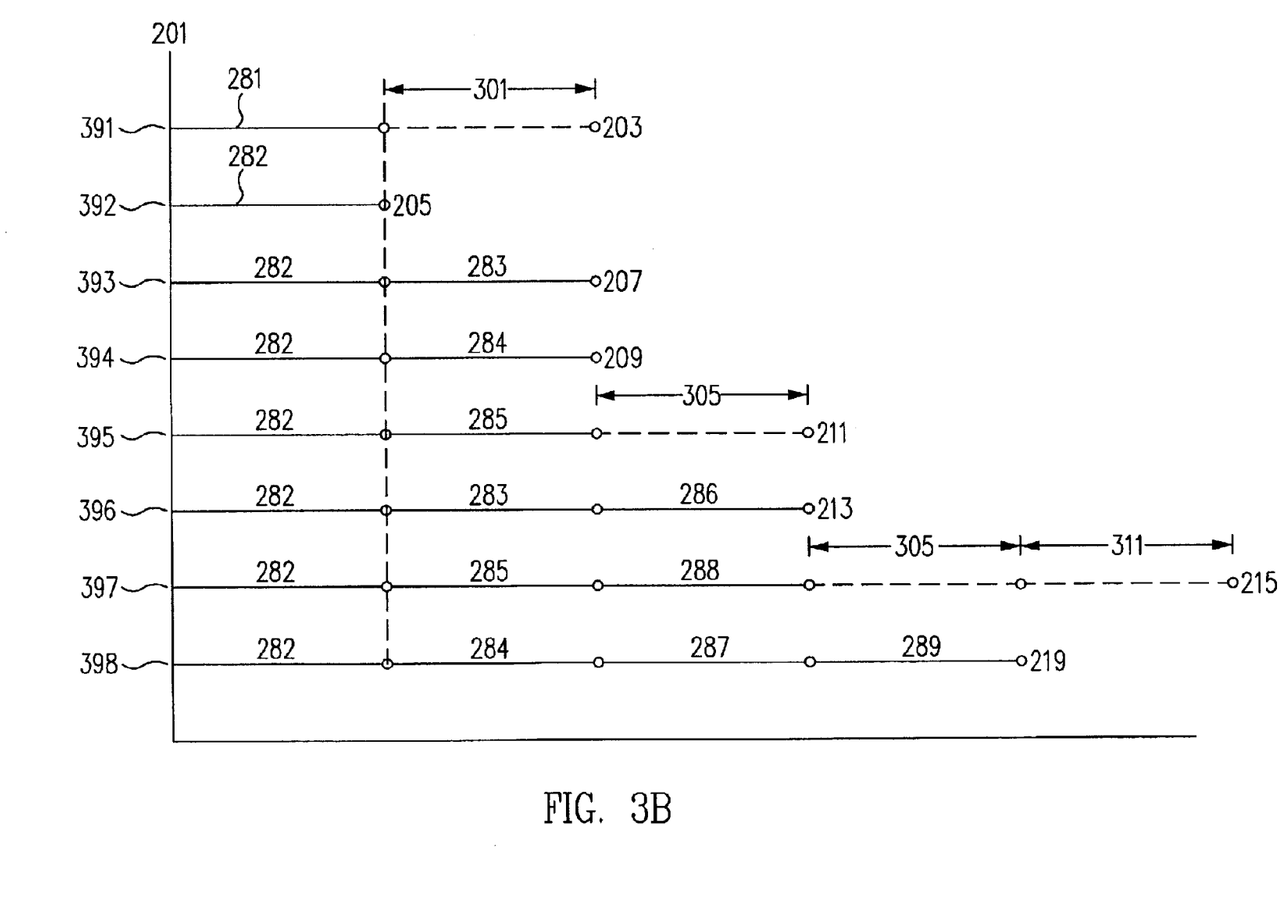
FIG. 3B shows the result of a distance/delay analysis as calculated according to the principles of the present invention.

FIG. 3B shows the result of a distance/delay analysis as is calculated according to the principles of the present invention. As seen in FIG. 3B, viewed in combination with FIG. 3A, calculating effective distances, according to the invention, path 391, connecting points 201 and 203, is the length of path segment 281 combined with the length of by-pass path 301, or two "units". This is in contrast to the prior art result that path 291, connecting paths 201 and 203 (FIG. 2B), was only one "unit". Using the method of the invention: path 392, connecting points 201 and 205, is still simply the length of path segment 282, or one "unit", the same as the prior art result for path 292; path 393, connecting points 201 and 207, is still the combined length of path segment 282 and path segment 283, or two "units", the same as the prior art result for path 293; and path 394, connecting points 201 and 209, is still the combined length of path segment 282 and path segment 284, or two "units", as was the case with path 294.

Using the method of the invention, path 395, connecting points 201 and 211, is the combined length of path segment 282, path segment 285 and by-pass path 305, or three "units". This is in contrast to the result of two "units" calculated for path 295 (FIG. 2B) using prior art methods. Using the method of the invention, the result for path 396, connecting points 201 and 213, is still the combined length of path segments 282, 283 and 286, or three "units" and path 398, connecting points 201 and 219, is still the combined length of path segments 282, 284, 287 and 289, or four "units", as was calculated for path 298 (FIG. 2B).

Finally, using the method of the invention, path 397, connecting points 201 and 215, is the combined length of path segments 282, 285 and 288, and the length of by-pass paths 305 and 311 for a total of five "units". This is in contrast to the length of three "units for path 297 calculated using prior art methods.

As discussed above, using only the "raw" distances, as was done in the prior art, paths 391 and 392 would have been treated as equal length and, therefore, it would have been assumed that a clock signal traveling from point 201 to points 203 and 205 would arrive at the same time. Likewise, paths 393, 394 and 395 would have been treated as equal length and it would have been assumed that a clock signal traveling from point 201 to points 207, 209 and 211 would arrive at the same time. In addition, using only the "raw" distances, as was done in the prior art, paths 396 and 397 would have been treated as equal length and, therefore, it would be assumed that a clock signal traveling from point 201 to points 203 and 205 would arrive at the same time. However, as shown in FIG. 3B, path 391 is two "units" long, and therefore represents two "units" of delay while path 392 is one "unit" long and therefore is only one "unit" of delay. Consequently, using prior art methods, one "unit" of clock skew would be introduced. Likewise, as shown in FIG. 3B, path 395 is three "units" long, and therefore represents three "units" of delay while paths 393 and 394 are each two "units" long and therefore are only two "units" of delay each. Consequently, using prior art methods, at least another "unit" of clock skew would be introduced. Finally, as shown in FIG. 3B, path 397 is five "units" long, and therefore represents five "units" of delay while path 396 is three "units" long and therefore is only three "units" of delay. Therefore, using prior art methods, another two "units" of clock skew would be introduced. Consequently, even in this very simple example, the prior art methods of using "raw" distances to calculate delay (FIG. 2B) results in at least five units of clock skew being introduced. However, using the blockage aware zero skew clock routing method of the invention (FIG. 3B) a more realistic delay estimate is produced and therefore at least five units of clock skew are eliminated. In a real microprocessor system there would be potentially hundreds and/or thousands of blockages. Consequently, the blockage aware zero skew clock routing method of the invention can potentially save hundreds and/or thousands of clock skew "units" in a real microprocessor and thus yield even more dramatic results.

FIG. 4 shows one embodiment of a blockage aware zero skew clock routing method 400 according to the principles of the present invention. Blockage aware zero skew clock routing method 400 begins at 401 and a first point (201 in FIGS. 2A and 3A), typically the clock input pin, and second point (points 203, 205, 207, 209, 211, 213, 217, 215 or 219 in FIGS. 2A and 3A) are designated at 403. At 405, a path between the first and second points is then checked for blockages. If no blockages are present, leg 409 is taken and the "raw" distance is calculated between the first and second points at 411. In this instance, this "raw" distance is also the effective distance. The "raw" distance is then used to estimate the delay between the first and second points at 413.

If a blockage is present at 405 then action path 407 is taken and, according to the invention, the "raw" distance is not calculated 415 and the path with the blockage is treated as an exception 417 and is either further processed or simply taken out of consideration. The method ends at 419.

Those of skill in the art will readily recognize that several modifications can be made to the blockage aware zero skew clock routing method 400 according to the principles of the present invention including, but not limited to, reversing the order of the calculation of "raw" distances 411 and the checking for blockages 405. For instance, in other embodiments of the invention, depending on the desires of the user, the "raw" distances can first be calculated for all paths, with or without blockages, and then the paths can be checked for blockages. Consequently, Applicant does not wish to be limited to the specific embodiments shown for illustrative purposes.

FIG. 5 shows another embodiment of a blockage aware zero skew clock routing method 500 according to the principles of the present invention. Blockage aware zero skew clock routing method 500 begins at 501 and a first point (201 in FIGS. 2A and 3A), typically the clock input pin, and second point (points 203, 205, 207, 209, 211, 213, 217, 215 or 219 in FIGS. 2A and 3A) are designated at 503. A path between the first and second points is then chosen and, according to this embodiment of the invention, the "raw" distance between the first and second points is then calculated at 505.

Once the "raw" distance is calculated at 505, the chosen path between the first and second points is then checked for blockages at 507. If no blockages are present at 509, then leg 513 is taken and the "raw" distance between the first and second points is also the effective distance. The "raw" distance is then used at 521 to estimate the delay between the first and second points. The method ends at 523.

If a blockage is present at 509, then according to the invention, the path with the blockage is treated as an exception and a by-pass path to channel the signal around the blockage is determined at 515 and the length of the by-pass path is calculated. The length of the by-pass path is then added at 517 to the "raw" distance calculated at 505. The delay is then estimated using the effective distance consisting of the combined "raw" distance and by-pass path distance at 519. The method ends at 523.

Those of skill in the art will readily recognize that several modifications can be made to the blockage aware zero skew clock routing method 500 according to the principles of the present invention including, but not limited to, reversing the order of the calculation of "raw" distances 521 and the checking for blockages 507. For instance, in other embodiments, depending on the desire of the designer, blockages can be checked for prior to calculating the "raw" distances. Consequently, Applicant does not wish to be limited to the specific embodiments shown for illustrative purposes.

As shown above, according to the invention, and unlike prior art methods, the inevitable path blockages, such as those created by the placement of circuit blocks, reserved channels and routing, pre-existing power and ground terminals, or one of several other microprocessor components, along the path between two points in a microprocessor is not ignored and the blockages are considered in making delay determinations. In addition, in one embodiment of the invention, the delay associated with a by-pass path is accurately calculated and added to the analysis to provide even greater design flexibility and accuracy. Consequently, electronic systems designed according to the blockage aware zero skew clock routing method of the invention will have less clock skew problems and will show improved performance at today's higher clock speeds.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the blockage aware zero skew clock routing method of invention were shown with a specific order of operations. However, those of skill in the art will recognize that several modifications can be made to the method including, but not limited to, reversing the order of the calculation of "raw" distances and the checking for blockages. Consequently, Applicant does not wish to be limited to the specific embodiments shown for illustrative purposes.

What is claimed is:

1. A blockage aware zero skew clock routing method for calculating delay between points in an electronic system, the blockage aware zero skew clock routing method comprising:

designating a first point in said electronic system;

designating a second point in said electronic system;

designating a path between said first point and said second point;

checking for blockages on said path between said first point and said second point;

if a blockage exists on said path between said first point and said second point, treating said path as an exception;

if no blockage exists on said path between said first point and said second point, calculating a raw distance between said first point and said second point; and if no blockage exists on said path between said first point and said second point using said raw distance to estimate a signal propagation delay between said first point and said second point.

2. The blockage aware zero skew clock routing method of claim 1; wherein,
said electronic system is a microprocessor.

3. The blockage aware zero skew clock routing method of claim 2; wherein,
said first point is a clock-in pin on said microprocessor for receiving a clock signal.

4. A blockage aware zero skew clock routing method for calculating delay between points in an electronic system, the blockage aware zero skew clock routing method comprising:
designating a first point in said electronic system;
designating a second point in said electronic system;
designating a path between said first point and said second point;
calculating a raw distance between said first point and said second point on said path;
estimating a signal propagation delay between said first point and said second point using said raw calculated distance between said first point and said second point;
checking for blockages on said path between said first point and said second point; and
if a blockage exists on said path between said first point and said second point, treating said path as an exception.

5. The blockage aware zero skew clock routing method of claim 4; wherein,
said electronic system is a microprocessor.

6. The blockage aware zero skew clock routing method of claim 5; wherein,
said first point is a clock-in pin on said microprocessor for receiving a clock signal.

7. A blockage aware zero skew clock routing method for calculating delay between points in an electronic system, the blockage aware zero skew clock routing method comprising:
designating a first point in said electronic system;
designating a second point in said electronic system;
designating a path between said first point and said second point;
calculating a raw distance on said path between said first point and said second point;
checking for blockages on said path between said first point and said second point;
if a blockage exists on said path between said first point and said second point, treating said path with an exception routine, said exception routine comprising;
designating a by-pass path around said blockage;
calculating a length of said by-pass path;
adding said calculated length of said by-pass path to said raw distance between said first point and said second point to obtain an effective distance between said first point and said second point; and
estimating a signal propagation delay between said first point and said second point using said effective distance between said first point and said second point; and
if no blockage exists on said path between said first point and said second point using said raw distance to estimate a signal propagation delay between said first point and said second point.

8. The blockage aware zero skew clock routing method of claim 7; wherein,
said electronic system is a microprocessor.

9. The blockage aware zero skew clock routing method of claim 8; wherein,
said first point is a clock-in pin on said microprocessor for receiving a clock signal.

10. A blockage aware zero skew clock routing method for calculating delay between points in an electronic system, the blockage aware zero skew clock routing method comprising:
designating a first point in said electronic system;
designating a second point in said electronic system;
designating a path between said first point and said second point;
checking for blockages on said path between said first point and said second point;
if a blockage exists on said path between said first point and said second point, treating said path with an exception routine, said exception routine comprising;
calculating a raw distance on said path between said first point and said second point;
designating a by-pass path around said blockage;
calculating a length of said by-pass path;
adding said calculated length of said by-pass path to said raw distance between said first point and said second point to obtain an effective distance between said first point and said second point; and
estimating a signal propagation delay between said first point and said second point using said effective distance between said first point and said second point;
if no blockage exists on said path between said first point and said second point, calculating a raw distance between said first point and said second point; and
if no blockage exists on said path between said first point and said second point using said raw distance to estimate a signal propagation delay between said first point and said second point.

11. The blockage aware zero skew clock routing method of claim 10; wherein,
said electronic system is a microprocessor.

12. The blockage aware zero skew clock routing method of claim 11; wherein,
said first point is a clock-in pin on said microprocessor for receiving a clock signal.

13. A blockage aware zero skew clock routing method for calculating delay between points in an electronic system, the blockage aware zero skew clock routing method comprising:
designating a first point in said electronic system;
designating a second point in said electronic system;
designating a path between said first point and said second point;
checking for blockages on said path between said first point and said second point;
if a blockage exists on said path between said first point and said second point, treating said path with an exception routine, said exception routine comprising;
designating a by-pass path between said first point and said second point;
calculating a distance between said first point and said second point along said by-pass path; and
estimating a signal propagation delay between said first point and said second point using said calculated distance between said first point and said second point;
if no blockage exists on said path between said first point and said second point, calculating a raw distance between said first point and said second point; and if no blockage exists on said path between said first point and said second point using said raw distance to estimate a signal propagation delay between said first point and said second point.

14. The blockage aware zero skew clock routing method of claim 13; wherein,
said electronic system is a microprocessor.

15. The blockage aware zero skew clock routing method of claim 14; wherein,
said first point is a clock-in pin on said microprocessor for receiving a clock signal.

16. A blockage aware zero skew clock routing method for calculating delay between points in an electronic system, the blockage aware zero skew clock routing method comprising:
designating a first point in said electronic system;
designating a second point in said electronic system;
designating a path between said first point and said second point;
calculating a raw distance of said path between said first point and said second point;
checking for blockages on said path between said first point and said second point;
if a blockage exists on said path between said first point and said second point, treating said path with an exception routine, said exception routine comprising;
designating a by-pass path between said first point and said second point;
calculating a distance between said first point and said second point along said by-pass path; and
estimating a signal propagation delay between said first point and said second point using said calculated distance between said first point and said second point on said by-pass path;
if no blockage exists on said path between said first point and said second point using said raw distance to estimate a signal propagation delay between said first point and said second point.

17. The blockage aware zero skew clock routing method of claim 16; wherein,
said electronic system is a microprocessor.

18. The blockage aware zero skew clock routing method of claim 17; wherein,
said first point is a clock-in pin on said microprocessor for receiving a clock signal.

\* \* \* \* \*